(12) United States Patent
Rozen et al.

(10) Patent No.: US 9,093,989 B2
(45) Date of Patent: Jul. 28, 2015

(54) CLOCK SIGNAL GENERATOR MODULE, INTEGRATED CIRCUIT, ELECTRONIC DEVICE AND METHOD THEREFOR

(75) Inventors: Anton Rozen, Gedera (IL); Michael Priel, Netanya (IL); Yossi Shoshany, Gan Yavne (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/352,706

(22) PCT Filed: Nov. 21, 2011

(86) PCT No.: PCT/IB2011/055213
§ 371 (c)(1),
(2), (4) Date: Apr. 18, 2014

(87) PCT Pub. No.: WO2013/076524
PCT Pub. Date: May 30, 2013

(65) Prior Publication Data
US 2014/0253204 A1    Sep. 11, 2014

(51) Int. Cl.
*H03K 5/14* (2014.01)
*H03K 3/012* (2006.01)
*H03K 5/135* (2006.01)
*H03K 19/0175* (2006.01)

(52) U.S. Cl.
CPC ............... *H03K 3/012* (2013.01); *H03K 5/135* (2013.01); *H03K 5/14* (2013.01); *H03K 19/017581* (2013.01)

(58) Field of Classification Search
CPC ............. H03K 3/012; H03K 5/135; H03K 19/017581; H03K 5/14
USPC ........... 327/298, 99, 143, 198, 291, 293, 295, 327/296, 297
See application file for complete search history.

(56) References Cited

U.S. PATENT DOCUMENTS

| 7,772,910 B2* | 8/2010 | Lee et al. ............... 327/291 |
| 8,013,635 B2 | 9/2011 | Jain et al. |
| 2006/0218428 A1 | 9/2006 | Hurd |
| 2007/0152739 A1 | 7/2007 | Banerjee et al. |
| 2008/0120065 A1 | 5/2008 | Joshi et al. |
| 2008/0252329 A1 | 10/2008 | Muniandy et al. |
| 2010/0194400 A1 | 8/2010 | Baumann et al. |

OTHER PUBLICATIONS

International Search Report and Written Opinion correlating to PCT/IB2011/055213 dated Jul. 30, 2012.

* cited by examiner

Primary Examiner — Jung Kim

(57) ABSTRACT

A clock signal generator module arranged to generate at least one clock signal for at least one functional module is described. The clock signal generator module comprises a first clock source component associated with at least one functional module, at least one further clock source component associated with the at least one functional module, and at least one management unit arranged to controllably enable signal generation by the first and at least one further clock source components in accordance with at least one operating characteristic of the at least one functional module associated therewith.

20 Claims, 4 Drawing Sheets

US 9,093,989 B2

CLOCK SIGNAL GENERATOR MODULE, INTEGRATED CIRCUIT, ELECTRONIC DEVICE AND METHOD THEREFOR

FIELD OF THE INVENTION

This invention relates to a clock signal generator module, integrated circuit, electronic device and method therefor.

BACKGROUND OF THE INVENTION

Integrated circuit (IC) devices intended for use within, for example, mobile devices, such as wireless communication devices, have to meet high performance requirements. In order to achieve maximum potential performance for individual IC devices, various operational conditions, such as process corner, temperature, etc. that affect the performance capabilities of individual IC devices must be compensated for. As such, it is known to implement voltage and/or frequency self-adjustment techniques that attempt to optimise performance of IC devices with respect to such device specific conditions.

A known technique for self-adjustment of the frequency of a functional module within an IC device comprises the use of a clock oscillator, such as a ring oscillator, that is representative of a critical path of the functional module. In this manner, such operational conditions also affect the clock oscillator, thereby allowing automatic adjustment of the frequency to compensate for such conditions.

However, these conventional techniques do not take into consideration variations in the performance and capabilities of the clock oscillators and functional modules, over time and/or through use. In particular, conventional techniques do not take into consideration differences between the ageing of the clock oscillators used to generate clock signals, as compared with the ageing of the functional modules that use such clock signals.

Two examples of causes of such ageing of clock oscillators and functional modules are Negative Bias Temperature Instability (NBTI) and Hot Carrier Injection (HCI). In the case of NBTI (ageing due to a presence of voltage on transistor gates), if a clock oscillator is used for multiple functional modules within an IC device that are independently powered, the clock oscillator will age faster than each individual functional module since the clock oscillator is required to be 'powered' if any one of the functional modules is powered. In the case of HCI (ageing due to switching activity), where a functional module is clocked on either a positive edge or a negative edge of a clock oscillator signal, the clock oscillator will switch at twice the rate of a respective functional module, and thus suffer twice the ageing effect.

As a result of this more aggressive ageing experienced by a clock oscillator, the performance of the clock oscillator will degrade at a greater rate than that of the functional module(s) reliant thereon. As such, as the performance of the clock oscillator degrades and the signal generated thereby slows over time, the potential performance of the functional module(s) reliant thereon will not be fully utilized.

SUMMARY OF THE INVENTION

The present invention provides a clock signal generator module, integrated circuit device, an electronic device and a method of generating at least one clock signal for at least one functional module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
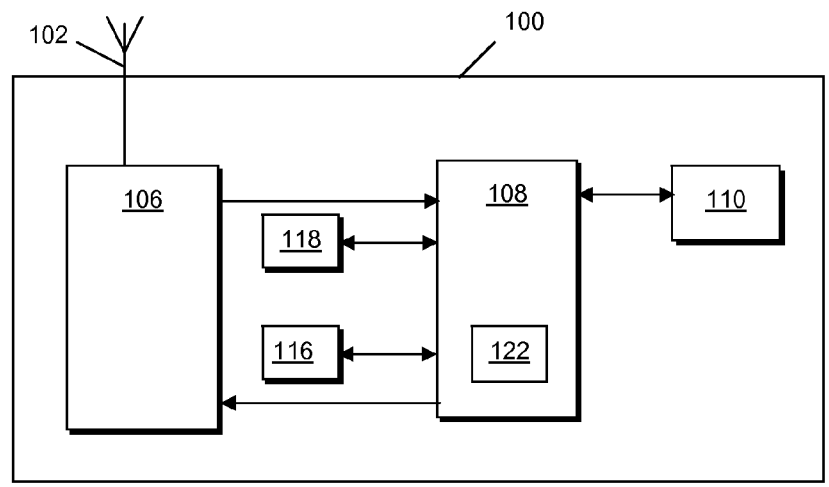
FIG. 1 illustrates an example of a simplified block diagram of part of an electronic device.

Referring first to FIG. 1, there is illustrated an example of a simplified block diagram of part of an electronic device, which in the illustrated example is a wireless communication unit 100. The wireless communication unit 100, is a mobile telephone handset comprising an antenna 102. The wireless communication unit 100 contains a variety of well known radio frequency (RF) components or circuits 106, operably coupled to the antenna 102, which for clarity reasons only will not be described further herein. The wireless communication unit 100 further comprises signal processing logic 108. An output from the signal processing logic 108 is connected to a suitable user interface (UI) 110 comprising, for example, a display, keypad, microphone, speaker, etc., to input/output signals in a human perceptible form from/to a user.

In the example, the signal processing logic 108 is coupled to a memory element 116 that stores operating regimes, such as decoding/encoding functions and the like and may be realised in a variety of technologies, such as: random access memory (RAM)(volatile), (non-volatile) read only memory (ROM), Flash memory or any combination of these or other memory technologies. A timer 118 may be coupled to the signal processing logic 108 in order to control a timing of operations within the communication unit 100.

Figure 2:
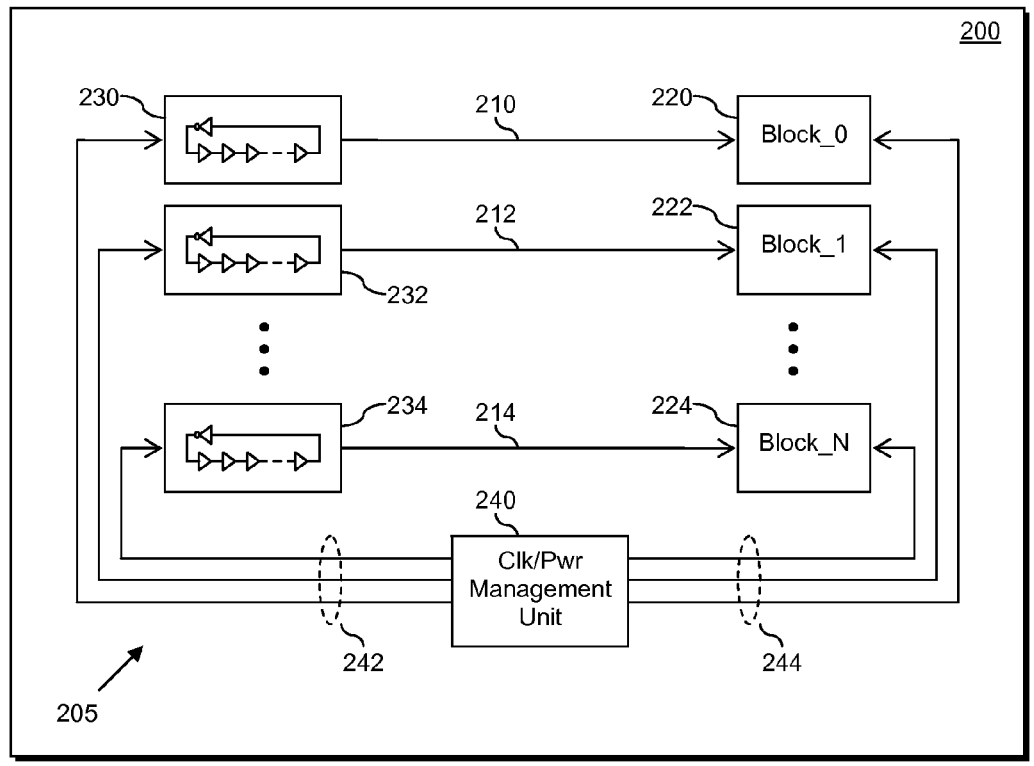
FIG. 2 illustrates an example of a part of an integrated circuit device comprising a clock signal generator module.

Referring now to FIG. 2, there is illustrated a simplified block diagram of an example of part of an integrated circuit device 200, such as may be implemented within, say, the radio frequency components or circuits 106 and/or the signal processing logic 108 of the wireless communication unit 100 of FIG. 1. The integrated circuit device 200 of FIG. 2 comprises a clock signal generator module 205 arranged to generate clock signals 210, 212, 214 for a plurality of functional modules 220, 222, 224. For example, the functional modules 220, 222, 224 may comprise asynchronously clocked functional blocks. The clock signal generator module 205 comprises clock source components 230, 232, 234, each clock source component 230, 232, 234 being associated with one of the functional modules 220, 222, 224 and arranged to generate the respective clock signals, 210, 212, 214. In the illustrated example, the clock source components 230, 232, 234 comprise clock oscillators, more specific in this example ring oscillators. The clock signal generator module 205 further comprises a management unit 240 arranged to controllably enable signal generation by the clock source components 230, 232, 234 in accordance with at least one operating characteristic of their respective functional module 220, 222, 224 associated therewith.

For example, the management unit 240 may be arranged to controllably enable signal generation by the individual clock source components 230, 232, 234 based on periods of operation of the respective functional modules 220, 222, 224 associated therewith. For example, the management unit 240 may comprise, or form a part of, a power management unit for the clock source components 230, 232, 234, and may be arranged to power up and power down the individual clock source components 230, 232, 234 to substantially match the periods of operation of the respective functional modules 220, 222, 224 associated therewith. Accordingly, the management unit 240 may be operably coupled to each of the clock source components 230, 232, 234 via control signals 242, via which the management unit 240 is able to power up/power down the individual clock source components 230, 232, 234.

In some examples, the management unit 240 may also comprise, or form a part of, a power management unit for the functional modules 220, 222, 224, and thus may be arranged to power up and power down the individual clock source components 230, 232, 234 substantially concurrently with the respective functional modules 220, 222, 224 associated therewith. Accordingly, the management unit 240 may also be operably coupled to each of the functional modules 220, 222, 224 via control signals 244, via which the management unit 240 is able to power up/down the individual functional modules 220, 222, 224.

In this manner, each of the clock source components 230, 232, 234 may be controlled such that it comprises operational periods that substantially match those of the respective functional module 220, 222, 224 associated therewith. Thus, ageing of the clock source components 230, 232, 234, say due to the presence of voltage on their transistor gates (Negative Bias Temperature Instability), may be substantially matched to that of the respective functional module 220, 222, 224 associated therewith. Accordingly, the performance of the clock source components 230, 232, 234 may be arranged to degrade through NBTI at substantially the same rate as that of the respective functional module 220, 222, 224 associated therewith. As such, as the performance of the clock source components 230, 232, 234 and the respective functional module 220, 222, 224 degrades over time, the potential performance of the respective functional module 220, 222, 224 reliant thereon may be remain substantially fully utilized.

Figure 3:
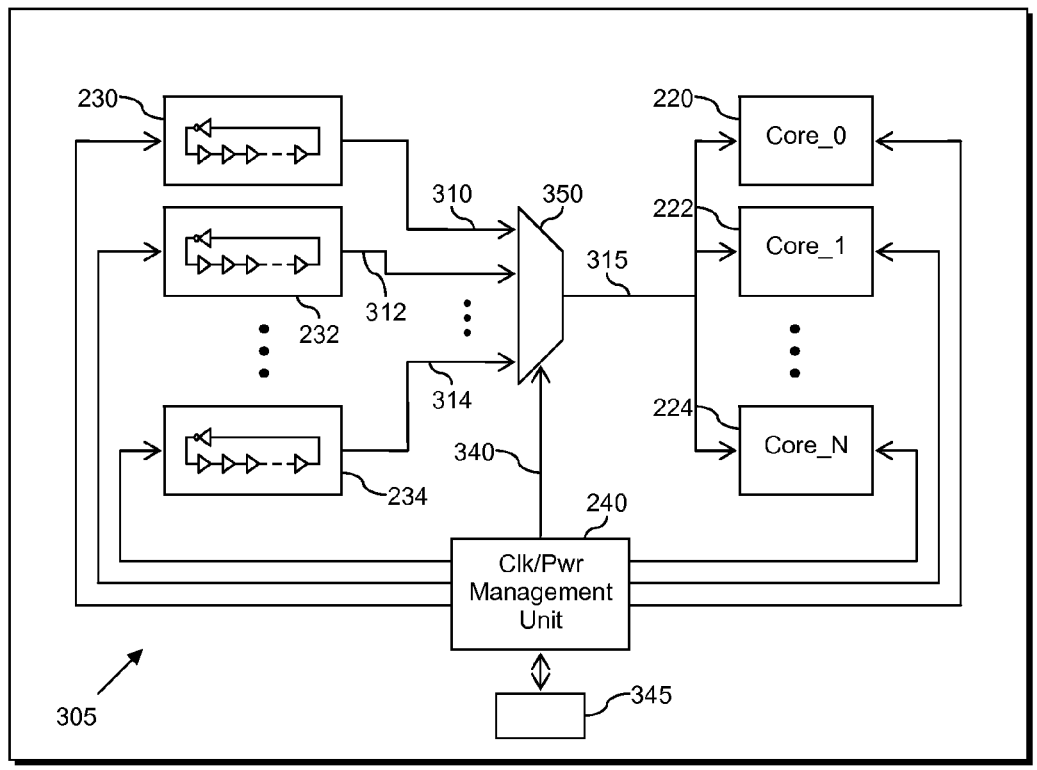
FIG. 3 illustrates an alternative example of a clock signal generator module.

Referring now to FIG. 3, there is illustrated a simplified block diagram of an example of an alternative clock signal generator module 305 arranged to generate a single clock signal 315 for a plurality of functional modules 220, 222, 224. For example, the functional modules 220, 222, 224 may comprise synchronously clocked functional blocks, such as processing cores as illustrated in FIG. 3. The clock signal generator module 305 comprises clock source components 230, 232, 234, each clock source component 230, 232, 234 being associated with one or more of the functional modules 220, 222, 224 and arranged to generate respective signals, 310, 312, 314. For example, a first clock source component 230 may be associated with at least one functional module 220, and at least one further clock source 232, 234 may be associated with at least one further functional module 222, 224.

The clock generator module 305 further comprises a management unit 240 arranged to controllably enable signal generation by the clock source components 230, 232, 234 in accordance with at least one operating characteristic of the respective functional module(s) 220, 222, 224 associated therewith. For example, the management unit 240 may be arranged to controllably enable signal generation by the individual clock source components 230, 232, 234 based on periods of operation of the respective functional modules 220, 222, 224 associated therewith, such as described above in relation to the clock signal generator module 205 of FIG. 2. In this manner, each of the clock source components 230, 232, 234 may be controlled such that it comprises operational periods that substantially match those of the respective functional module 220, 222, 224 associated therewith. Thus, ageing of the clock source components 230, 232, 234, for example due to the presence of voltage on their transistor gates (Negative Bias Temperature Instability) may be substantially matched to that of the respective functional module 220, 222, 224 associated therewith. Accordingly, the performance of the clock source components 230, 232, 234 may be arranged to degrade through NBTI at substantially the same rate as that of the respective functional module 220, 222, 224 associated therewith.

In the example illustrated in FIG. 3, the clock signal generator module 305 is arranged to selectively output a clock signal 315 comprising one of the signals 310, 312, 314 output by the clock source components 230, 232, 234. For example, the clock signal generator module 305 is arranged to selectively output a clock signal 315 comprising the signal 310, 312, 314 output by one of the clock source components 230, 232, 234 associated with an active functional module (e.g. a functional module currently powered up) comprising a highest power up/power down ratio. Significantly, the functional module comprising the highest power up/power down ratio (e.g. one that has been powered up for the longest overall period of time) will typically comprise the greatest degradation in performance as a result of ageing due to the presence of voltage on their transistor gates. In the example illustrated in FIG. 3, the clock signal generator module 305 comprises a multiplexer 350 arranged to receive at data inputs thereof the signals 310, 312, 314 output by the clock source components 230, 232, 234, and to selectively output as the clock signal 315 one of the received signals 310, 312, 314 in accordance with a control signal 340 received from the at least one management unit 240. Furthermore, the management unit 240 may be arranged to store, for example within memory element 345, statistical data relating to power up/down ratios for the functional modules 220, 222, 224, and to determine which of the active functional modules 220, 222, 224 comprises the highest power up/down down ratio based on such statistical data.

In this manner, the clock signal 315 output by the clock signal generator module 305 may comprise a signal generated by a clock source component 230, 232, 234 for which ageing has been arranged to substantially match that of the active functional module with the highest power up/power down ratio. In this manner, performance of the active functional modules 220, 222, 224 may be substantially optimized in accordance with the active functional module comprising the highest power up/down ratio.

Figure 4:
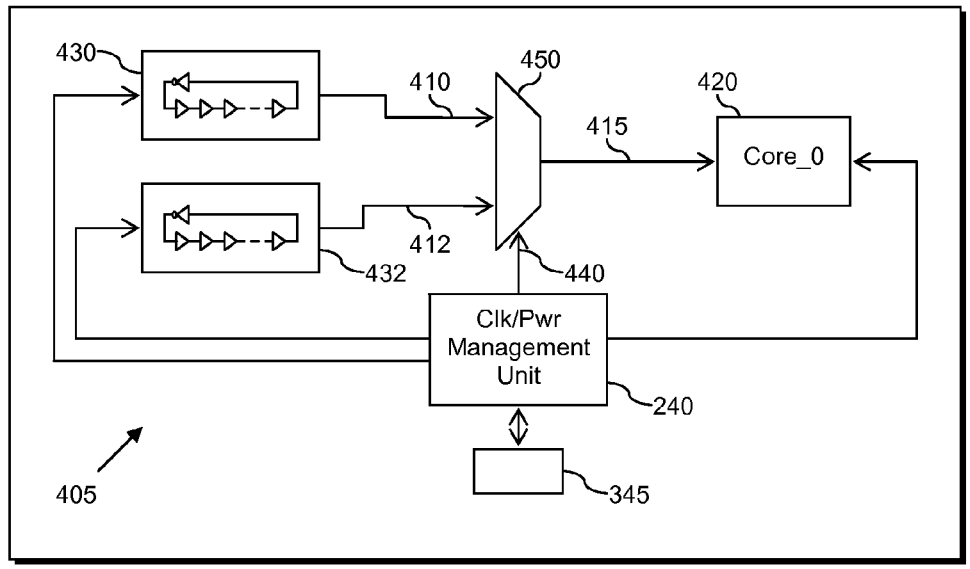
FIG. 4 illustrates an alternative example of a clock signal generator module.

Referring now to FIG. 4, there is illustrated a simplified block diagram of an example of an alternative clock signal generator module 405 arranged to generate a single clock signal 415 for a one or more functional module(s) 420. The clock signal generator module 405 comprises clock source components 430, 432, each clock source component 430, 432 being associated with the one or more functional module(s) 420 and arranged to generate respective clock signals 410, 412. The clock signal generator module 405 further comprises a management unit 240 arranged to controllably enable signal generation by the clock source components 430, 432 in accordance with switching activity for the functional module 420 associated therewith. For example, the management unit 240 may be arranged to cyclically enable signal generation of the clock source components 430, 432 to substantially match switching activity for the functional module 420 associated therewith. For example, where switching activity for the functional module comprises, say, 60% of the clock signal provided thereto, the management unit 240 may be arranged to cyclically enable signal generation of the clock source components 430, 432 such that signal generation for each of the clock source components 430, 432 is enabled for 60% of the time. In this manner, ageing of the clock source components 430, 432 due to switching activity (e.g. HCI) may be substantially matched to that of the functional module 420 associated therewith. Accordingly, the performance of the clock source components 430, 432 may be arranged to degrade through HCI at substantially the same rate as that of the functional module 420 associated therewith.

In the illustrated example, the management unit 240 may be arranged to cyclically enable signal generation of the clock source components 430, 432 such that the periods of time in which the respective clock source components 430, 432 are disabled are offset, and the clock signal generator module 405 may be arranged to output a clock signal 415 comprising interleaved signals 410, 412 output by the clock source components 430, 432. For example, the clock signal generator module 405 comprises a multiplexer 450 arranged to receive at data inputs thereof the signals 410, 412 output by the clock source components 430, 432, and to selectively output as the clock signal 415 one of the received signals 410, 412 in accordance with a control signal 440 received from the management unit 240.

In some examples, the management unit 240 may be arranged to controllably enable signal generation by the clock source components 430, 432 based at least partly on a pre-configured switching ratio for the functional module associated therewith. For example, such a pre-configured switching ratio may be determined based on test data or the like, and stored within memory element 345. Additionally and/or alternatively the management unit 240 may be arranged to controllable enable signal generation by the clock source components 430, 432 based at least partly on a derived switching ratio for the respective functional module 420 associated therewith. For example, a switching ratio for the functional module 420 may be derived at least partly from, say, statistical data obtained for clock gating functionality of the functional module 420; for example such clock gating functionality also being managed and/or controlled by the management unit 240.

Figure 5:
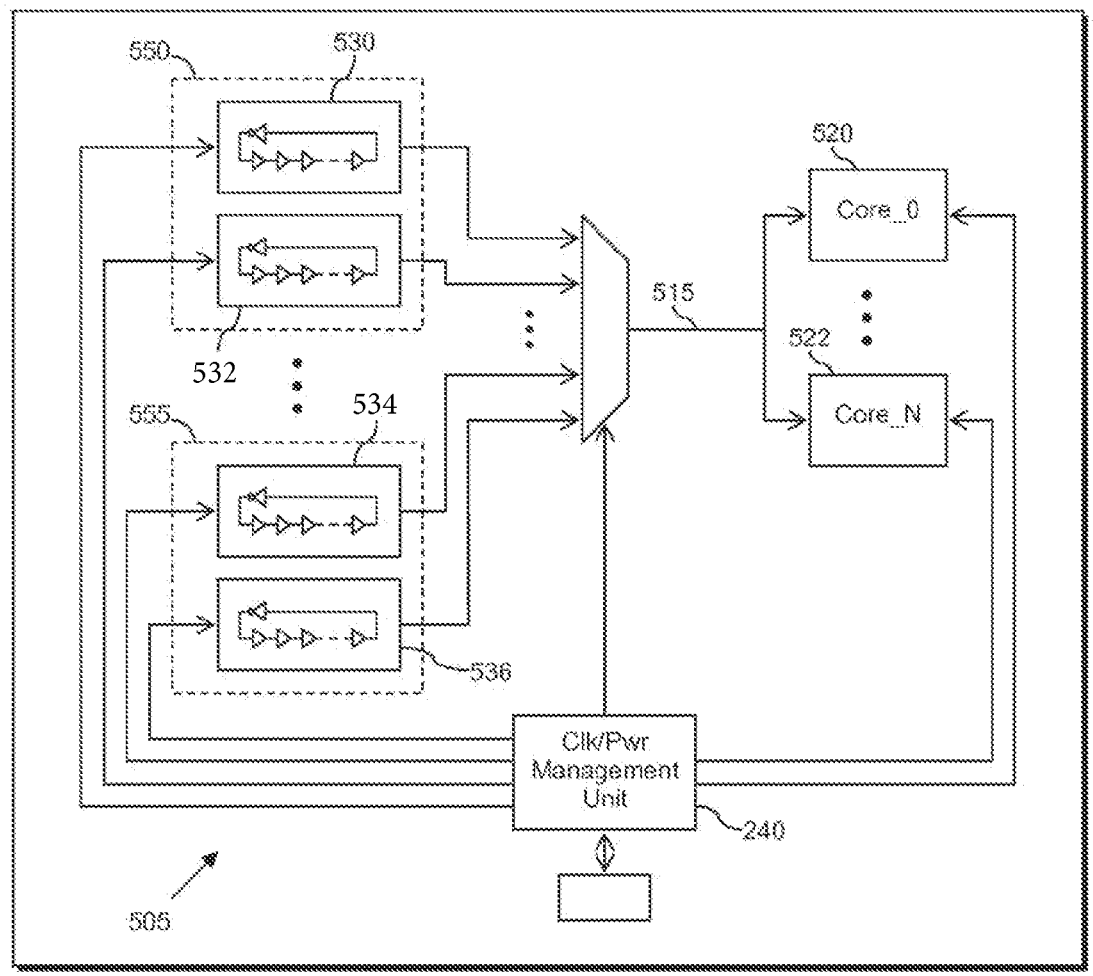
FIG. 5 illustrates an alternative example of a clock signal generator module.

Referring now to FIG. 5, there is illustrated a simplified block diagram of an example of an alternative clock signal generator module 505 arranged to generate a clock signal 515 for a plurality of functional modules 520, 522. The clock signal generator module 505 comprises clock source components 530, 532, 534, 536; each clock source component 530, 532, 534, 536 being associated with at least one of the functional modules 520, 522, and arranged to generate respective signals 510, 512, 514, 516. In particular for the example illustrated in FIG. 5, the clock source components 530, 532, 534, 536 are arranged into groups 550, 555, each group 550, 555 being associated with a functional module 520, 522 and comprising, in the illustrated example, a pair of clock source components 530, 532 and 534, 536 respectively.

The clock signal generator module 505 further comprises a management unit 240 arranged to controllably enable signal generation by the clock source components 530, 532, 534, 536 in accordance with periods of operation of the respective functional module(s) 520, 522 associated therewith, as well as in accordance with switching activity for the functional module(s) 520, 522 associated therewith.

For example, the management unit 240 may be arranged to controllably enable signal generation by individual groups 550, 555 of clock source components 530, 532, 534, 536 based on periods of operation of the respective functional modules 520, 522 associated therewith. In this manner, each group 550, 555 of clock source components 530, 532, 534, 536 may be controlled such that the clock source components 530, 532, 534, 536 therein comprise operational periods that substantially match those of the respective functional module 520, 522 associated therewith. Thus, ageing of the clock source components 530, 532, 534, 536 due to the presence of voltage on their transistor gates (e.g. NBTI) may be substantially matched to that of the respective functional module 520, 522 associated therewith.

In addition, the management module 240 may further be arranged to controllably enable signal generation by the clock source components 530, 532, 534, 536 in accordance with switching activity for the functional module(s) 520, 522 associated therewith. For example, the management unit 240 may be arranged to cyclically enable signal generation of the clock source components 530, 532, 534, 536 to substantially match switching activity for the functional modules 520, 522 associated therewith. In this manner, ageing of the clock source components 530, 532, 534, 536 due to switching activity (e.g. HCI) may also be substantially matched to that of the functional modules 520, 522 associated therewith.

For clarity and ease of understanding, alternative example arrangements have been illustrated separately within FIGS. 2 to 5. However, it will be appreciated that such arrangements are not limited to being implemented in isolation, and any combination of such arrangements may be equally implemented. For example, the arrangement illustrated in FIG. 2 for asynchronously clocked functional blocks may be implemented in combination with, say, one of the arrangements illustrated in FIGS. 3 to 5 for synchronously clocked functional blocks.

Figure 6:
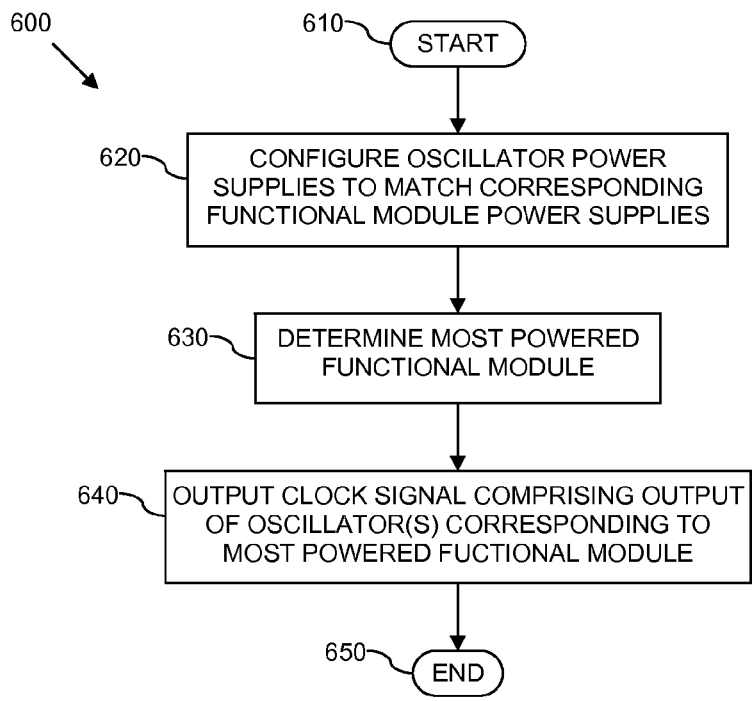
FIG. 6 illustrates a simplified flowchart of an example of a method of generating at least one clock signal for at least one functional module.

Referring now to FIG. 6, there is illustrated a simplified flowchart 600 of an example of a method of generating a clock signal for at least one functional module. The method starts at 610, and moves on to 620 where, in the illustrated example, power supplies for clock source components (e.g. ring oscillators) are configured (e.g. to power up or power down) to substantially match power supplies of functional modules associated with the respective clock source components. In this manner, signal generation by each clock source component may be enabled based at least partly on periods of operation of the respective functional module(s) associated therewith. Next, at 630, an active functional module comprising a highest power up/power down ratio is determined. A clock signal is then output comprising a signal output by a clock source component associated with the determined active functional module comprising the highest power up/power down ratio, at 640. The method then ends at 650.

Figure 7:
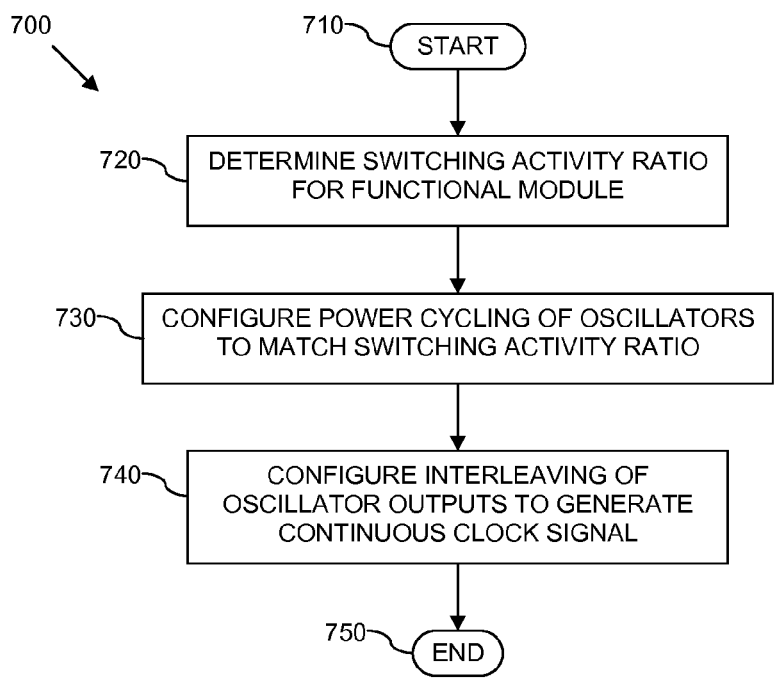
FIG. 7 illustrates a simplified flowchart of an alternative example of a method of generating at least one clock signal for at least one functional module.

Referring now to FIG. 7, there is illustrated a simplified flowchart 700 of an alternative example of a method of generating a clock signal for at least one functional module. The method starts at 710, and moves on to 720 where a switching activity ratio is determined for at least one functional module. Next, at 730, power cycling of clock source components associated with the at least one functional module is configured to substantially match the determined switching activity ratio of the at least one functional module associated therewith. Interleaving of signals output by the clock source components is then configured to generate a substantially continuous clock signal, at 740, and the method ends at 750.

For clarity and ease of understanding, alternative example methods have been illustrated separately within FIGS. 6 and 7. However, it will be appreciated that such methods are not limited to being implemented in isolation, and such methods may be equally implemented in combination. For example, the method illustrated in FIG. 7 may be implemented in, say, 640 of the method illustrated in FIG. 6.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A clock signal generator module arranged to generate at least one clock signal for a plurality of functional modules of an integrated circuit, the clock signal generator module comprising:

a first clock source component and at least one further clock source component, each associated with at least one associated functional module out of said functional modules, and arranged to generate a respective clock signal for said associated functional module; and at least one management unit arranged to controllably enable signal generation by the first and at least one further clock source components in accordance with at least one operating characteristic of the at least one associated functional module associated with the respective clock source, said characteristic being related to an ageing of a behaviour of the at least one associated functional module, the at least one management unit to cause the performance of the first clock source component and the performance of the at least one further clock source component to reduce at substantially the same rate as that of the respect associated functional module.

2. The clock signal generator module of claim 1, wherein the first clock source component is associated with at least a first functional module and the at least one further clock source component is associated with at least one other, second functional module.

3. The clock signal generator module of claim 1, wherein the at least one management unit is arranged to controllably enable signal generation by the first clock source component and the at least one further clock source component based at least partly on periods of operation of the at least one functional module associated therewith.

4. The clock signal generator module of claim 1, wherein the clock signal generator module is arranged to selectively output a clock signal comprising a signal output by at least one of the first clock source component and the at least one further clock source component.

5. The clock signal generator module of claim 4, wherein the clock signal generator module is arranged to selectively output a clock signal comprising a signal output by the at least one clock source component associated with an active functional module comprising a highest power up/down ratio.

6. The clock signal generator module of claim 4, wherein the clock signal generator module comprises a multiplexer component arranged to receive at data inputs thereof signals output by the first clock source component and the at least one further clock source component, and to selectively output one of the received signals in accordance with a control signal received from the at least one management unit.

7. The clock signal generator module of claim 1, wherein the at least one management unit is arranged to controllably enable signal generation by the first clock source component and the at least one further clock source component based at least partly on switching activity for the at least one functional module associated therewith.

8. The clock signal generator module of claim 7, wherein the at least one management unit is arranged to cyclically enable signal generation of the first clock source component and the at least one further clock source component to match switching activity for the at least one functional module associated therewith.

9. The clock signal generator module of claim 8, wherein the clock signal generator module is arranged to output a clock signal comprising interleaved signals output by the first and at least one further clock source components for which signal generation is cyclically enabled.

10. The clock signal generator module of claim 7, wherein the at least one management unit is arranged to controllably enable signal generation by the first clock source component and the at least one further clock source component based at least partly on a pre-configured switching ratio for the at least one functional module associated therewith.

11. The clock signal generator module of claim 7, wherein the at least one management unit is arranged to controllably enable signal generation by the first clock source component and the at least one further clock source component based at least partly on a derived switching ratio for the at least one functional module associated therewith.

12. The clock signal generator module of claim 1, wherein the first clock source component and the at least one further clock source component comprise ring oscillators.

13. The clock signal generator module of claim 1, wherein a first and at least one further functional module of the functional modules comprise processing core modules.

14. An integrated circuit device comprising a clock signal generator module as claimed in claim 1.

15. An electronic device comprising a clock signal generator module as claimed in claim 1.

16. A method of generating at least one clock signal for at least one functional module of an integrated circuit, the method comprising:
  determining, by a management unit, whether a first functional module of the integrated circuit is operational;
  if the first functional module is operational, enabling, by the management unit, signal generation of a first clock signal by a first clock source component, otherwise not enabling signal generation of the first clock signal by the first clock source component, wherein the first clock source component provides the first clock signal to the first functional module in response to being enabled;
  determining whether a second functional module of the integrated circuit is operational; and
  if the second functional module is operational, enabling signal generation of a second clock signal by a second clock source component, otherwise not enabling signal generation of the second clock signal by the second clock source component, wherein a performance of the second clock source is reduced at substantially the same rate as second functional module in response to enabling the second clock source component only when the second functional module is operational.

17. The method of claim 16, further comprising: selectively outputting a clock signal by at least one of the first clock source component and the second clock source component.

18. The method of claim 16, further comprising: controllably enabling signal generation by the first clock source component and the second clock source component based at least partly on switching activity for the first functional module and the second functional module.

19. An integrated circuit device comprising:
  a first function module;
  a second function module;
  a first clock source component coupled to the first functional module, the first clock source component to generate a first clock signal, and to provide the first clock signal to the first functional module;
  a second clock source component coupled to the second functional module, the second clock source component to generate a second clock signal, and to provide the second clock signal to the second functional module; and
  a management unit to controllably enable signal generation by the first clock source component in accordance with an operating characteristic of the first functional module related to an aging of the first functional module, and to controllably enable signal generation by the second clock source component in accordance with an operating characteristic of the second function module related to an aging of the second functional module, wherein control of the first clock source component substantially matches an aging of the first clock source to the aging of the first functional module, and control of the second clock source component substantially matches an aging of the second clock source to the aging of the second functional module.

20. The integrated circuit device of claim 19, wherein the first clock source component and the second clock source component comprise ring oscillators.

\* \* \* \* \*